United States Patent
Saniter et al.

(10) Patent No.: US 9,455,569 B2
(45) Date of Patent: Sep. 27, 2016

(54) PROCEDURES FOR THE OPERATION OF AN ELECTRICAL CIRCUIT

(71) Applicant: GE Energy Power Conversion GmbH, Berlin (DE)

(72) Inventors: Christoph Saniter, Berlin (DE); Marco Boni, Berlin (DE); Sebastian Hildebrandt, Berlin (DE); Jörg Janning, Berlin (DE); Roland Jakob, Berlin (DE)

(73) Assignee: GE Energy Power Conversion GMBH, Berlin (DE)

( * ) Notice: Subject to any disclaimer, the term of this patent is extended or adjusted under 35 U.S.C. 154(b) by 399 days.

(21) Appl. No.: 13/715,671

(22) Filed: Dec. 14, 2012

(65) Prior Publication Data

US 2013/0272039 A1  Oct. 17, 2013

(30) Foreign Application Priority Data

Dec. 22, 2011 (DE) .......................... 10 2011 089 606

(51) Int. Cl.
*H02H 7/122* (2006.01)
*H02M 1/32* (2007.01)
*H02M 7/797* (2006.01)
*G01R 31/02* (2006.01)
G01R 31/40 (2014.01)
G01R 27/18 (2006.01)

(52) U.S. Cl.
CPC .......... *H02H 7/1227* (2013.01); *G01R 31/025* (2013.01); *H02M 1/32* (2013.01); *H02M 7/797* (2013.01); *G01R 27/18* (2013.01); *G01R 31/40* (2013.01)

(58) Field of Classification Search
CPC .. H02H 7/1227; G01R 31/025; G01R 27/18; G01R 31/40
USPC .......................................................... 324/509
See application file for complete search history.

(56) References Cited

U.S. PATENT DOCUMENTS

| | | | | |
|---|---|---|---|---|
| 3,488,580 A | * | 1/1970 | Anderson | G01R 31/08 324/536 |
| 3,869,664 A | * | 3/1975 | Safer | G01R 31/025 324/509 |
| 3,887,866 A | * | 6/1975 | Safer | G01R 31/025 324/509 |
| 4,293,813 A | * | 10/1981 | Groenenboom | H02H 3/332 324/117 R |

(Continued)

FOREIGN PATENT DOCUMENTS

| | | |
|---|---|---|
| DE | 19860721 A1 | 6/2000 |
| EP | 1909368 A2 | 4/2008 |

OTHER PUBLICATIONS

Patent Abstracts of Japan No. 2008312403 A (with reference), published Dec. 25, 2008.

(Continued)

*Primary Examiner* — Jermele M Hollington
*Assistant Examiner* — Christopher McAndrew
(74) *Attorney, Agent, or Firm* — Wood IP LLC

(57) ABSTRACT

A method for operating an electrical circuit is described herein. The circuit includes a power converter having a plurality of switches and two capacitors that are parallel to the switches. The plurality of switches and the two capacitors are connected in series. The power converter has two AC voltage-sided connections and a measuring resistor is connected to the ground. A ground fault is detected by measuring a voltage drop in a measuring resistor.

11 Claims, 4 Drawing Sheets

(56) References Cited

U.S. PATENT DOCUMENTS

| | | | | |
|---|---|---|---|---|
| 4,809,123 | A * | 2/1989 | Allington | G01R 19/16571 324/509 |
| 4,843,515 | A * | 6/1989 | Richman | H02H 9/04 324/509 |
| 6,518,769 | B1 * | 2/2003 | Ammon | G01R 31/11 324/524 |
| 6,967,454 | B1 * | 11/2005 | Braun | H02P 29/02 318/563 |
| 7,489,487 | B2 * | 2/2009 | Oka | H02M 7/487 361/30 |
| 7,612,576 | B1 | 11/2009 | Heller et al. | |
| 7,626,396 | B2 * | 12/2009 | Lindsey | B60L 3/0023 307/9.1 |
| 2004/0189330 | A1 * | 9/2004 | Herb | G01R 27/18 324/691 |
| 2008/0084215 | A1 * | 4/2008 | Itten | G01R 27/18 324/510 |
| 2009/0001993 | A1 * | 1/2009 | Lindsey | B60L 3/0023 324/509 |
| 2011/0012606 | A1 * | 1/2011 | Kawamura | B60L 3/0023 324/509 |
| 2011/0307196 | A1 * | 12/2011 | Schumacher | G01R 31/025 702/58 |

OTHER PUBLICATIONS

German Patent Office Search Report, Oct. 17, 2012.

Unofficial English Translation of European Search Report and Written Opinion issued in connection with corresponding EP Application No. 12193647.0-1809 on Sep. 25, 2014.

\* cited by examiner

PROCEDURES FOR THE OPERATION OF AN ELECTRICAL CIRCUIT

FIELD OF THE INVENTION

The present invention generally involves an electrical circuit and a method for operating the electrical circuit. More specifically, the invention relates to a method for detecting a ground fault within the electrical circuit.

BACKGROUND OF THE INVENTION

A conventional method for operating a three-step inverter includes an inverter having an intermediate circuit with two capacitors from whose connecting point a measuring resistor is connected to the ground. A voltage drop in the measuring resistor while the converter is operating is measured. Depending on this measured voltage, it is determined whether a ground fault is present in the inverter.

One disadvantage of the known method is that a ground fault already present before the inverter's initial operation can only be determined when it is operating and this can damage the inverter. Therefore, an improved method for determining whether a ground fault is present in the electrical circuit that prevents damage to the inverter would be useful.

BRIEF DESCRIPTION OF THE INVENTION

Aspects and advantages of the invention are set forth below in the following description, or may be obvious from the description, or may be learned through practice of the invention.

One embodiment of the present invention is a method for operating an electrical circuit having a power converter. The power converter includes a plurality of switches connected in series with one another and two capacitors connected in series. The two capacitors are connected to one another in parallel to the plurality of switches. The power converter includes two AC voltage-sided connections and a measuring resistor that is connected to the two capacitors. The measuring resistor is connected to ground. The method includes measuring a voltage drop in the measuring resistor and determining the presence of a ground fault based on the measured voltage drop. The method further includes controlling the switches of the power converter such that the same potential is present in the AC voltage-sided connections and such that the potential changes from a first value to a second value.

Another embodiment of the present invention is an electrical circuit. The electrical circuit includes a power converter having a plurality of switches and two AC voltage-sided connections. At least two capacitors are connected in series with one another. The capacitors are parallel to the switches. Each capacitor defines a connecting point. A measuring resistor is connected to ground and to the connecting points of the capacitors. A control device is connected to the measuring resistor. The control device is configured to operate the electrical circuit so as to detect a ground fault based on a measured voltage drop in the measuring resistor.

Those of ordinary skill in the art will better appreciate the features and aspects of such embodiments, and others, upon review of the specification.

BRIEF DESCRIPTION OF THE DRAWINGS

A full and enabling disclosure of the present invention, including the best mode thereof to one skilled in the art, is set forth more particularly in the remainder of the specification, including reference to the accompanying figures, in which.

DETAILED DESCRIPTION OF THE INVENTION

Further characteristics, application possibilities and advantages of the invention result from the description of the invention's embodiments given below, which are shown in the associated figures. In them, all characteristics described or shown constitute—separately or in any combination—the object of the invention regardless of their combination in the patent claims or their back-reference and regardless of their formulation or representation in the description or figures.

Figure 1:
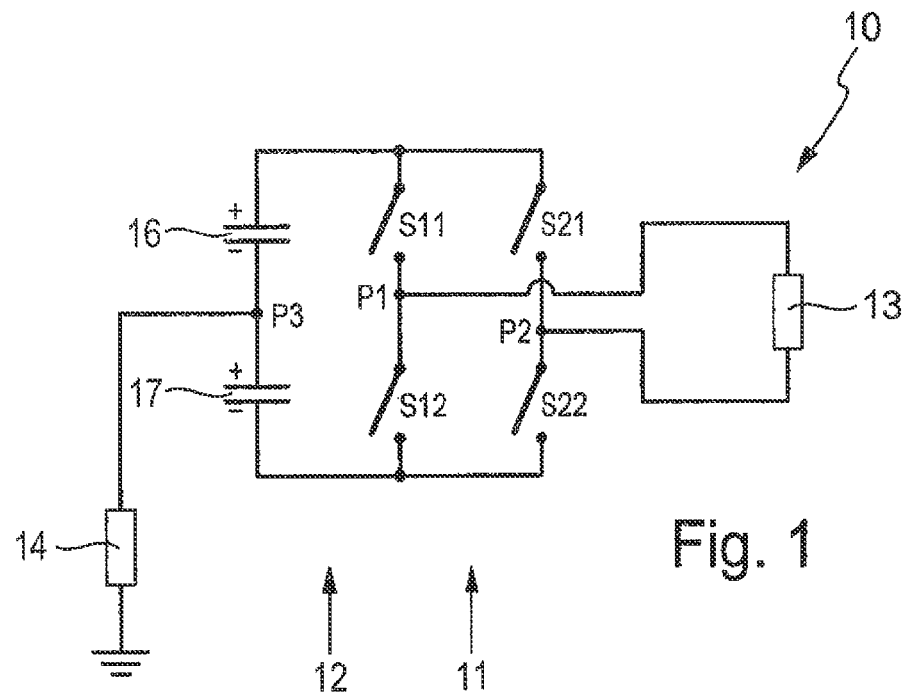
FIG. 1 provides an electrical wiring diagram of an electrical circuit with a power converter and a measuring resistor according to one embodiment of the invention.

FIG. 1 shows an electrical circuit 10 that comprises a power converter 11, an intermediate circuit 12, a load impedance 13 and a measuring resistor 14. In this embodiment, the intermediate circuit 12 has been designed for purposes of an easier explanation with two capacitors 16, 17 connected in series. The latter can also be provided differently, as will still be explained by means of FIG. 4. The electrical circuit 10 is designed potential-free, which means that, apart from the measuring resistor 14, no operating connection of any component of the electrical circuit 10 is grounded.

The power converter 11 has been designed as a so-called H bridge and has two connections in series connected parallel to one another, each one containing two switches S11, S12, S21, S22. The connecting point of switches S11, S12 and the connecting point of switches S21, S22 constitute the AC-sided connections P1, P2 of the power converter 11 and are connected to one another through the load impedance 13. The connection in series of the two capacitors 16, 17 is connected in parallel to the two connections in series mentioned above. The measuring resistor 14 is connected to the ground from the connecting point P3 of the two capacitors 16, 17. For example, another power converter (not shown) can be connected parallel to the two capacitors 16, 17 of the intermediate circuit 12 for, among other things, supplying power and thus charging the two capacitors 16, 17. If applicable, this additional power converter has also a potential-free design.

In operation, the power converter 11 is operated as a so-called 2-level power converter. This means that by correspondingly controlling the switches S11, S12, S21, S22 in the AC-sided connections P1, P2 of the power converter 11, either the positive potential or the negative potential of the two capacitors 16, 17 connected in series is present. The following method is carried out in addition to the actual operation of the electrical circuit 10. Preferably, this method should be applied before the actual operation of the electrical circuit, but it can also be carried out in a selective (if necessary, repeating) short-term interruption of the actual operation and/or after the error has been identified during the operation and/or after the operating electrical circuit 10 has been turned off. Likewise, the method can be integrated into the actual operation of the electrical circuit 10.

In one embodiment, each of the two capacitors 16, 17 are charged to a specified voltage. This voltage has been applied on the two capacitors 16, 17 of FIG. 1 in the same direction and is indicated in the Figures by "+" and "−". The capacitors 16, 17 can be charged by means of the above-mentioned additional power converter, for example. The switches S11, S12, S21, S22 can be opened while this takes place. Preferably, the specified voltage is lower than the usual operating voltage of the power converter 11. The switches S11, S12, S21, S22 are controlled in such a way that the two switches S11 and S21 are closed and the two switches S12 and S22 are opened. This corresponds to the electrical circuit 10' of FIG. 2A.

Figure 2A:
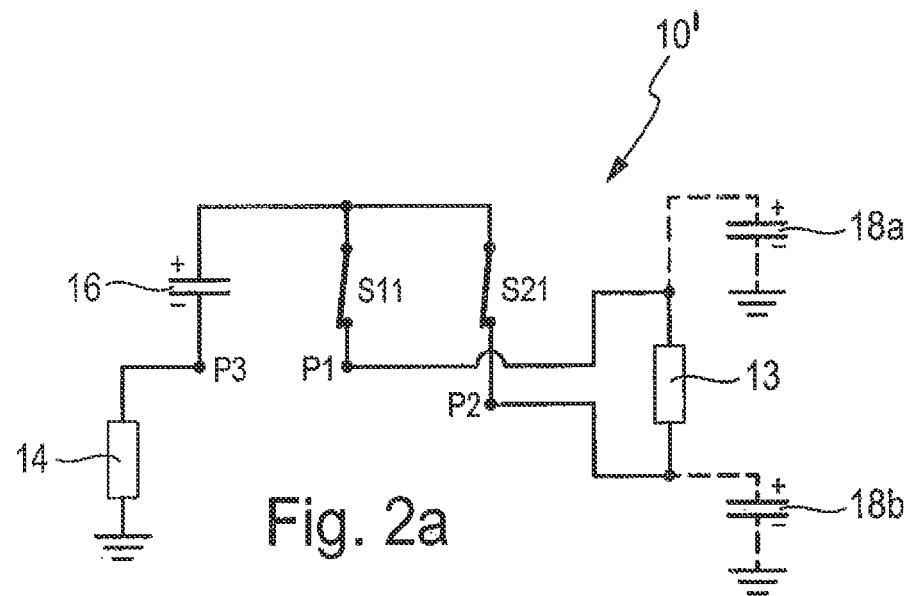
FIG. 2A provides an electrical wiring diagram of the electrical circuit as shown in FIG. 1 in certain switching states of the power converter's switches, according to one embodiment of the present invention.

As can be seen in FIG. 2A, the positively charged connection of capacitor 16 is connected to connection P1 via switch S11 and to connection P2 via switch S21. Thus, the same positive potential has been applied on both connections P1, P2 of the power converter 11. This means the same as saying that in a stationary state in the load impedance 13, the "zero" voltage drops. Afterwards, the switches S11, S12, S21 and S22 are controlled in such a way that the two switches S12, S22 are closed and the two switches S11, S21 are open. This corresponds to electrical circuit 10" of FIG. 2B. It follows from FIG. 2B that the negatively charged connection of capacitor 17 is connected to connection P1 via switch S12 and to connection P2 via switch S22. Thus, the same negative voltage is applied on the two connections P1 and P2. This means the same as saying that in a stationary state on the load impedance 13, the "zero" voltage drops.

Figure 2B:
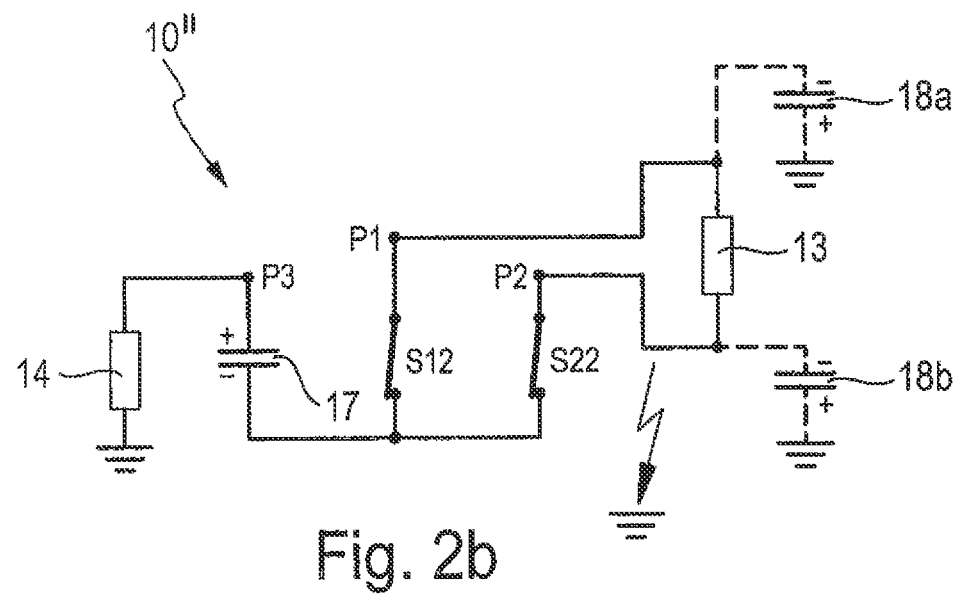
FIG. 2B provides an electrical wiring diagram of the electrical circuit as shown in FIG. 1 in certain switching states of the power converter's switches, according to one embodiment of the present invention.

Therefore, in both switching states of switches S11, S12, S21, S22 in accordance with FIGS. 2A and 2B, the same "zero" voltage is applied on the load impedance 13. However, both switching states differ in the fact that in FIG. 2A the load impedance 13 has the same positive potential in both connections P1 and P2, whereas in FIG. 2B the load impedance 13 has the same negative potential in both connections P1 and P2.

Parasitic capacitances 18a, 18b have been additionally drawn as dotted lines in FIGS. 2A and 2B. These parasitic capacitances 18a, 18b are exemplarily connected to the two connections P1 and P2 and therefore to the connections leading to the load impedance 13. It is obvious that the parasitic capacitances 18a, 18b can also be present in other places of the electrical circuit 10. It should be obvious to one or ordinary skill that parasitic inductances and/or parasitic resistances can also be present.

As explained above, when the two switching states of FIGS. 2A and 2B are switched over, the potential in connections P1 and P2 of power converter 11 change from an initial to a second value. As a result, the parasitic capacitances 18a and 18b reverse charges. With this charge reversal, a current is connected that flows through the measuring resistor 14, among other things. If one, for example, assumes a switching over from FIG. 2A to FIG. 2B, then this current will flow from the capacitor 17 through the measuring resistor 14 and to the ground, and from there through the parasitic capacitances 18a and 18b and both closed switches S12 and S22 back to the capacitor 17. This current reverses the charge of the parasitic capacitances 18a and 18b. If at all, only compensating currents flow through the load impedance 13 on both sides of it due to the differently-sized parasitic capacitances 18a and 18b.

The current flowing through the measuring resistor 14 changes the moment the switch-over takes place to a value not equal to zero and then gradually drops back to zero due to the recharging parasitic capacitances 18a and 18b. This flow of current causes a corresponding measuring voltage UM drop at the measuring resistor 14. This measuring voltage UM is measured.

Figure 3A:
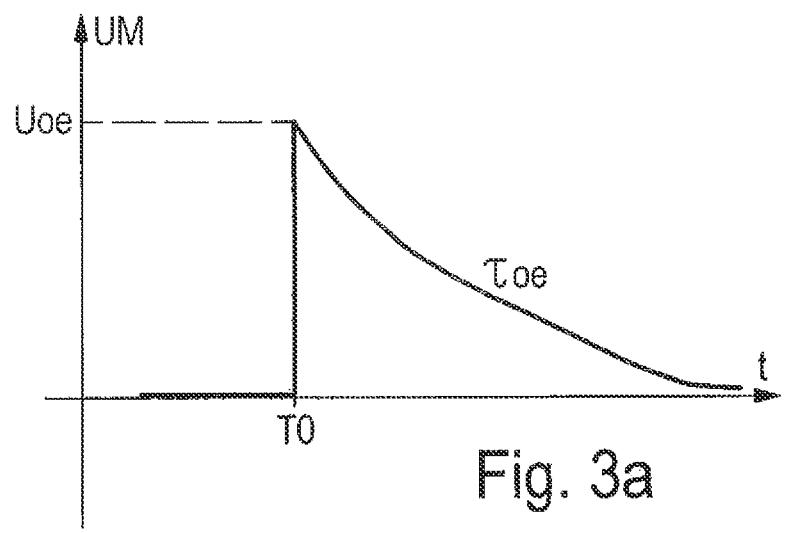
FIG. 3A provides voltage curves on the measuring resistor of the electrical circuit as shown in FIG. 1.
Figure 3B:
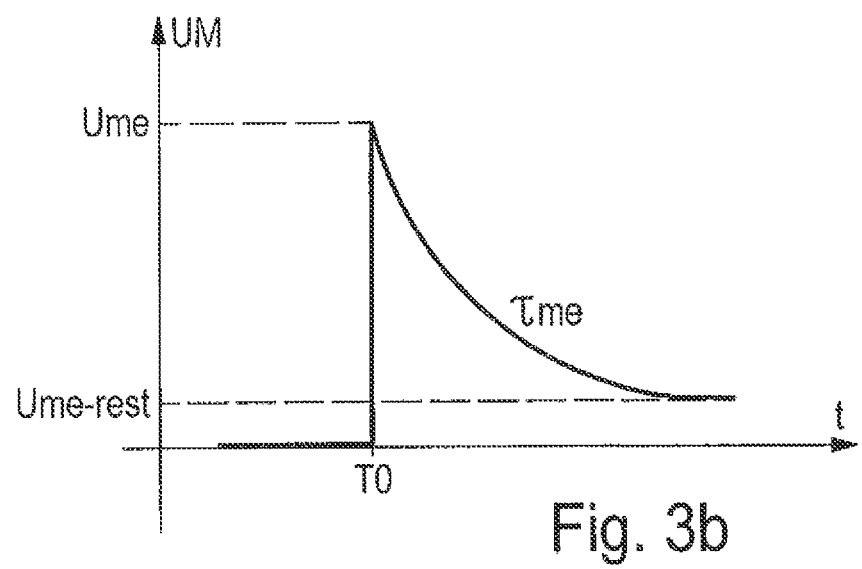
FIG. 3B provides voltage curves on the measuring resistor of the electrical circuit as shown in FIG. 1.

FIGS. 3A and 3B show the curve of the measuring voltage UM plotted against time t. In FIG. 3A, there no ground fault of the electrical circuit 10 present, whereas in FIG. 3B it is assumed that there is at least one ground fault of any component of the electrical circuit 10 connected to the ground. The switching over of the switching states of the switches according to FIG. 2A to those according to FIG. 2B takes place in FIGS. 3A and 3B at a point in time T0.

In FIG. 3A, as has been said before, it is assumed that no ground fault is present in the electrical circuit 10. This means that, apart from the measuring resistor 14, none of the components of the electrical circuit 10 has a connection leading to the ground. Owing to the current flowing as a result of the switch-over (explained above), the measuring voltage UM in FIG. 3A jumps to a certain voltage Uoe and then gradually drops back to zero with a time constant Toe.

Owing to the switch-over from FIG. 2A to FIG. 2B, the voltage Uoe is positive. The size of voltage Uoe depends on the operating values of the electrical circuit. The voltage Uoe can be determined beforehand either arithmetically or experimentally. The time constant Toe for the gradual drop of the measuring voltage Um from voltage Uoe to zero is especially dependent on the measuring resistor 14 and the parasitic capacitances 18a and 18b and can preferably be determined experimentally in advance. The voltage curve shown in FIG. 3A for the electrical circuit 10 without ground fault can therefore be determined in advance and stored, for example. This voltage curve is characteristic for the state "without ground fault" and from now on will also be called ideal curve.

As already explained, FIG. 3B assumes that there is a ground fault in electrical circuit 10. This ground fault is exemplarily shown in FIG. 2B on connection P2 of the power converter 11 and indicated with a lightning symbol pointing towards the ground. The ground fault can, for example, be more likely highly resistive if there is water damage or, in the case of metallic short circuits, have a low resistance. Due to the ground fault mentioned above, the parasitic capacitances 18b—present as such because of the grounded connection P2—at least change their value or are fully short-circuited. Thus, when the switch-over takes place from FIG. 2A to the switching states of FIG. 2B, the flow of current changes. Consequently, the measuring potential UM of FIG. 3B also deviates from the measuring potential UM of FIG. 3A. The measuring potential UM in FIG. 3B thus changes to a voltage Ume that can differ from the voltage Uoe of FIG. 3A. Furthermore, the time constant Toe of FIG. 3B (with which the measuring voltage UM gradually drops again) can change compared to the time constant Toe of FIG. 3A—and furthermore, too, a stationary residual voltage Ume-rest can remain in FIG. 3B compared to FIG. 3A. The explanations provided for the changes in the voltage Ume, the time constant Toe and the residual voltage Ume-rest can occur either alternatively or cumulatively.

In one embodiment, It is determined whether the voltage curve of the measured measuring potential UM deviates from the ideal curve explained after a switch-over takes place. If this does not occur within specified threshold values, then it is assumed that no ground fault is present. If, however, the voltage curve of the measuring voltage deviates substantially from the explained ideal curve in a switch-over, especially when the measured voltage curve exceeds the specified threshold values, then it is assumed that there is a ground fault in the electrical circuit 10, i.e. that a component of electrical circuit 10 is connected to the ground.

The method described above is carried out with a control device suitable for switching the switches S11, S12, S21 and S22 to the desired switching states. For this purpose, switches S11, S12, S21 and S22 can be executed as controllable power semiconductor elements or modules, for example as IGBTs (insulated gate bipolar transistors) or the like. In addition, the measuring voltage UM has been supplied to the control device. The control device can be, for example, a computer equipped with programs for executing the method explained above. Preferably, the control device is the same equipment that also controls the power converter 11.

The method explained above can also be modified by switching over the switching states of FIG. 2B to the ones of FIG. 2A. In alternate embodiments, rather than measuring potential UM, a current flowing through the measuring resistor 14 can be measured and established for the method explained above.

Figure 4:
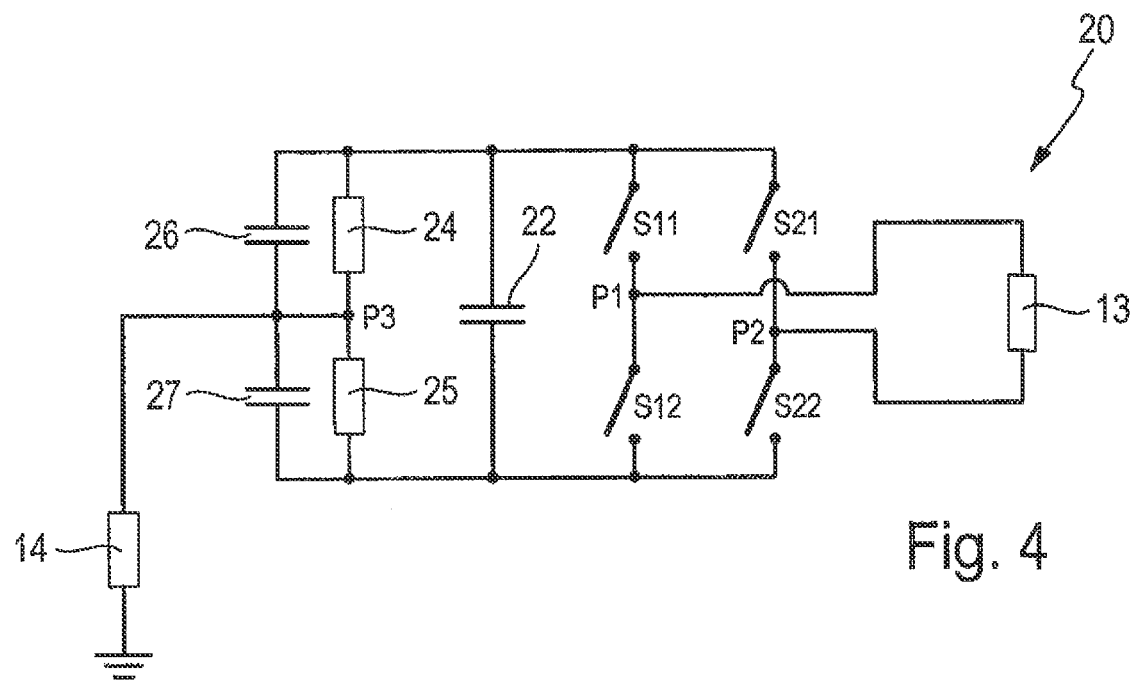
FIG. 4 provides an electrical wiring diagram of an alternative execution of the electrical circuit as shown in FIG. 1.

As previously disclosed, the intermediate circuit 12 of the electrical circuit 10 has the two capacitors 16 and 17 connected in series for purposes of an easier explanation. FIG. 4 now shows an electrical circuit 20 that largely matches the electrical circuit 10 shown in FIG. 1. Contrary to the electrical circuit 10 of FIG. 1, however, the electrical circuit 20 of FIG. 4 has one single intermediate circuit capacitor 22 that creates the intermediate circuit 12. Parallel to this intermediate circuit capacitor 22, a parallel connection made up of two connections in series has been connected in FIG. 4, whereby the first connection in series is made up of two resistances 24, 25 and the second connection in series is made up of two capacitors 26 and 27. The connecting points of the two resistances 24, 25 and of the two capacitors 26, 27 constitute the connecting point P3 to which the measuring resistor is connected. With the help of the resistances 24, 25 and the capacitors 26, 27, a voltage divider is created that splits up the voltage applied on the intermediate circuit capacitor 22 into two parts.

Depending on the dimensions, particularly those of resistances 14, 24, 25, it may be possible to eliminate the two capacitors 26, 27 if necessary. In this case, the voltage divider is solely made up of the two resistances 24, 25. It is also possible, to eliminate the voltage divider and to connect the measuring resistor 14 to the positive or negative connection of the intermediate circuit capacitor 22.

Figure 5:
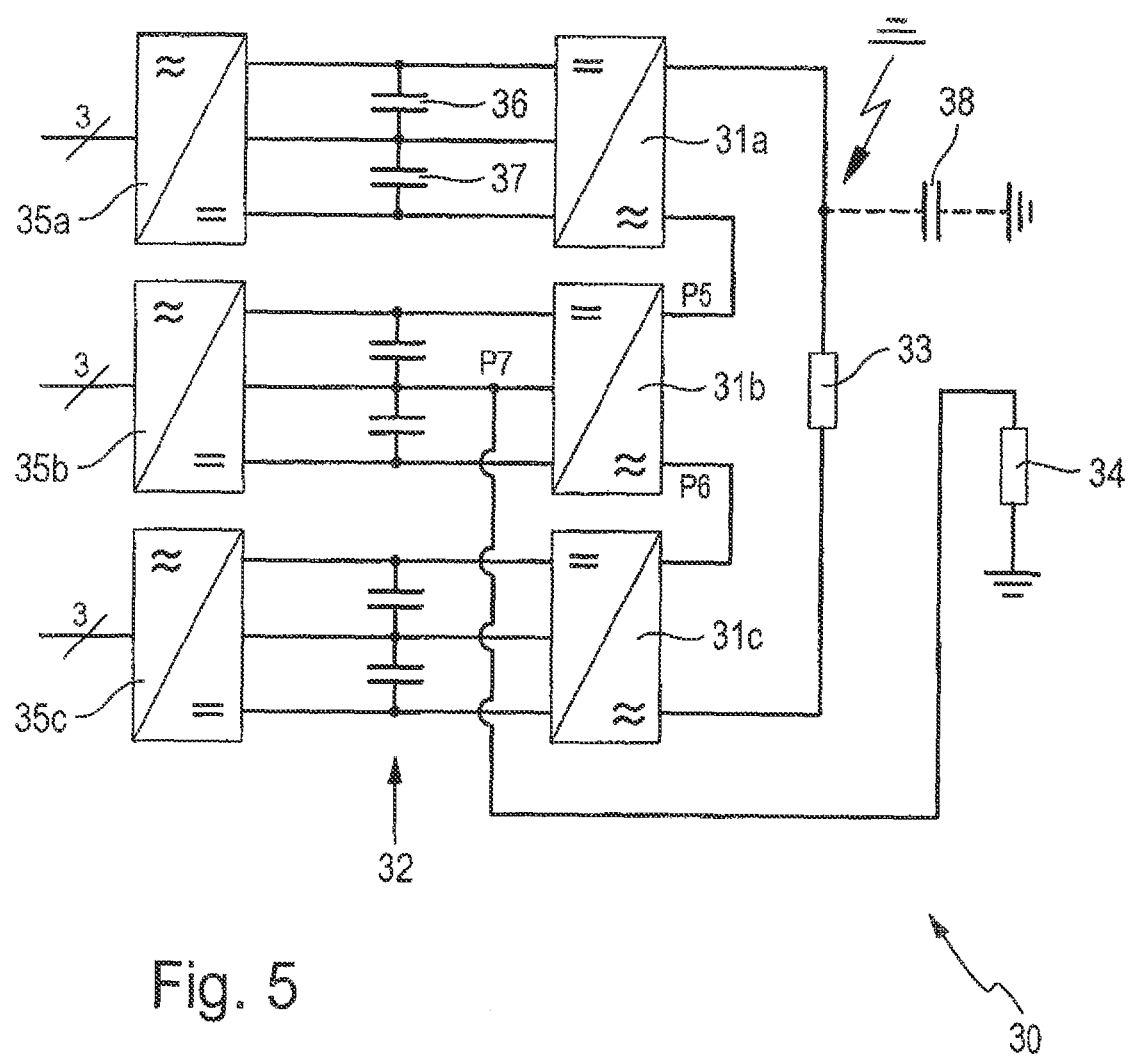
FIG. 5 provides an electrical wiring diagram of an electrical circuit including a connection in series consisting of several power converters, according to one embodiment of the present invention.

The functionality of the electrical circuit 20 of FIG. 4 largely corresponds to the electrical circuit 10 already described with the help of FIGS. 1, 2A, 2B, 3A and 3B, inasmuch as the same components of FIG. 4 have been identified with the same reference signs. In addition, the capacitors 26, 27 shown in the electrical circuit 20 of FIG. 4 correspond to the capacitors 16, 17 of the electrical circuit 10. FIG. 5 shows an electrical circuit 30 with an initial number of power converters 31a, 31b, 31c, an intermediate circuit 32, a load impedance 33, a measuring resistor 34 and a second number of power converters 35a, 35b, 35c.

Apart from the measuring resistor 34, the electrical circuit 30 is designed potential-free. In this embodiment, every one of the first and second number of power converters 31a, 31b, 31c, 35a, 35b, 35c are 3-level power converters capable of generating either a positive potential, a zero potential or a negative potential on its AC voltage-sided connections P5, P6. The first number of power converter 31a, 31b, 31c are connected in series with their AC voltage-sided connections. Furthermore, the second number of power converters 35a, 35b, 35c are in each case executed in three phases.

The power converters do not have to be executed as 3-level (i.e. 3-step) power converters and can have any number of steps. For example, the power converters may be 5-level power converters. It is likewise pointed out that the power converters may include any number of phases. In this embodiment, there are three power converters on both sides of the intermediate circuit 32. It must be mentioned that this first and/or second number can also be smaller or larger.

The intermediate circuit 12 includes a number of capacitors, in which case every one of the first number of power converters 31a, 31b, 31c has been allocated to a connection in series consisting of two capacitors 36, 37. The corresponding three connecting points of the capacitors 36, 37 are connected to the DC voltage-sided connections of the correspondingly associated power converters 31a, 31b, 31c, 35a, 35b, 35c. Starting from the connecting point P7 of the two capacitors 36, 37 belonging to the middle power converter 31b, the measuring resistor 14 is grounded. A measuring voltage UM has been applied to the measuring resistor 34.

Similarly to the electrical circuit 10 of FIG. 1, in the electrical circuit 30 of FIG. 5 all capacitors 36, 37 are also charged initially to a specified voltage. This can be done with the help of the second number of power converters 35a, 35b, 35c. Then, the switches of the first number of power converters 31a, 31b, 31c are controlled in such a way that the zero potential is present in all AC voltage-sided connections of these power converters. Then, for example, the switches of only the middle power converter 31b are switched over in such a way that a positive voltage is present in the AC voltage-sided connections P5, P6 of this middle power converter 31b. The switches of the remaining power converters 31a, 31b remain unchanged.

The "zero" voltage is applied on the load impedance 33 in both switching states of the switches of the initial number of power converters 31a, 31b, 31c. When switching over from the first to the second switching state, the potential in the connections P5, P6 of the middle power converter 31b changes from the zero potential to the positive potential. Owing to parasitic capacitances 38, this leads similarly to a flow of current and therefore to a voltage curve of the measuring voltage UM, as already explained for the electrical circuit 10 of FIG. 1 by means of FIG. 3A.

If there is no ground fault in electrical circuit 30 of FIG. 5, then the voltage curve of the measuring voltage UM represents once again an ideal curve that can be experimentally determined in advance for example. However, if a ground fault is present (as indicated by the lightning shown in FIG. 5), then the influence of the parasitic capacitances 38 changes and thus the voltage curve of the measuring voltage UM. If the voltage curve of the measuring voltage UM differs substantially from the ideal curve, then it is possible to infer a ground fault in the electrical circuit 30 of FIG. 5.

It should be understood that instead of the positive potential existing in the second switching state, a negative potential on the AC voltage-sided connections P5, P6 of the middle power converter 31b can also be generated. In this case, the switch-over from the first to the second switching state makes this potential to change from the zero potential to the negative potential. Consequently, this equally produces a measuring voltage UM, as already explained. It is also possible for the potential on the AC voltage-sided connections P5, P6 of the middle power converter 31b to change from a positive to a negative potential during the switch-over. This also leads, accordingly, to a measuring voltage UM.

As previously disclosed, the measuring voltage UM cannot only be tapped from the middle power converter 31b, but from every one of the existing power converters 31a, 31b, 31c. As has been explained, only a single measuring voltage or also any combination of two or more measuring voltages can be tapped when doing this. If several measuring voltages are tapped from power converters 31a, 31b and/or 31c, then the place of the ground fault can be located or at least delimited by a corresponding evaluation.

In particular embodiments, the electrical circuit is provided with a power converter having several switches and parallel to it with two capacitors connected in series, in which case the power converter has two AC-sided connections and a measuring resistor is connected to the ground from the connecting point of the two capacitors. In the method according to the invention and depending on a measuring voltage dropping at the measuring resistor, it is determined whether there is a ground fault. The switches of the power converters are controlled in such a way that, on the one hand, the same potential on the power converter's AC-sided connections is present and that, on the other hand, this potential changes from one initial value to a second value.

As a result, the charge of the parasitic capacitances that, among other things, occur from the power converter's grounded AC-sided connections, are reversed owing to the change in the matching potential occurring on the AC-sided connections. This charge reversal process leads to a current flow and therefore to a voltage drop in the measuring resistor that varies depending on whether there a ground fault is present or not. Therefore, it can be inferred from the measuring voltage dropping on the measuring resistor whether there is a ground fault. A measuring current can also be used instead of the measuring potential.

It should be obvious to one of ordinary skill that the method can be implemented regardless of the actual operation of the electrical circuit or also as part of it. Preferably, the method can be applied before the electrical circuit is operated for the first time. It is therefore possible to identify a ground fault without needing the circuit to be operating for this.

A further development of the invention determines whether the voltage curve of the measuring voltage changes with regard to an ideal curve after switching over from the initial to the second value. In all of this, it is especially advantageous if the voltage curve of the measuring voltage changes compared to the ideal curve after switching over, and if a ground fault is inferred from a significant deviation. Thanks to this method, and with the help of a simple comparison of voltage curves, it is possible to identify a ground fault in an electrical circuit.

In one embodiment, the method is carried out with a control device that is also provided for controlling the power converter. In this case, no additional devices are needed—particularly no additional hardware components—to implementing the invention.

It is furthermore advantageous if there are several power converters and if in this case the method according to the invention is carried out on two or several power converters. This allows the ground fault's location to be more precisely determined or at least delimited.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal language of the claims.

The invention claimed is:

1. A method for an electrical circuit comprising:
controlling a power converter having (i) a first series connection including at least two switches connected in series with one another, and connected in parallel with a second series connection including at least two switches connected in series with one another, and (ii) each having a potential electrically connected to the switches at an AC voltage-sided connection between the switches,
wherein the power converter is connected in parallel with a set of capacitors connected in series with one another, the set of capacitors being electrically connected on opposite sides of a non-neutral connection point;
measuring, when the potential at the AC voltage-sided connections between the switches changes from a first value to a second value during correspondingly switching of a respective switch from each of the at least two switches of the first series connection and the second series connection, a change in voltage in a measuring resistor from a first voltage to a second voltage, the measuring resistor being electrically connected between the non-neutral connection point and a ground; and
determining a ground fault exists within the electrical circuit when the second voltage is a residual voltage established in a stationary reference time that has a value not equal to zero.

2. The method of claim 1, further comprising comparing a voltage curve of the measured voltage to an ideal voltage curve after the potential switches from the first value to the second value.

3. The method of claim 2, further comprising determining a ground fault is present when a predetermined deviation exits between the measured voltage curve and the ideal voltage curve.

4. The method of claim 2, wherein the ideal voltage curve is generated based on the voltage curve of the measured voltage without a ground fault present.

5. The method of claim 2, wherein the ideal voltage curve is generated based upon at least one of calculations or empirical data.

6. The method of claim 1, further comprising measuring current flow through the measuring resistor to determine the presence of the ground fault.

7. The method of claim 1, wherein the electrical circuit comprises a plurality of power converters similarly configured, the method further comprising determining the presence of a ground fault based on the measured voltage drop in the measuring resistors of two or more of the plurality of power converters.

8. An electrical circuit comprising:
a power converter having a first series connection including at least two switches connected in series with one another and a second series connection including at least two switches connected in series with one another, and each having a potential electrically connected to the switches at an AC voltage-sided connection between the switches;
a set of capacitors connected in series with one another and connected in parallel to the power converter, wherein the set of capacitors is electrically connected on opposite sides of a non-neutral connection point; and
a measuring resistor electrically connected between the non-neutral connection point and a ground and configured to measure a change from a first voltage to a second voltage of the potential at the AC voltage-sided connections between the switches during correspondingly switching of a respective switch from each of the at least two switches of the first series connection and the second series connection , wherein a ground fault is determined to exist within the electrical circuit when the second voltage is a residual voltage established in a stationary reference time that has a value not equal to zero.

9. The electrical circuit of claim 8, further comprising a control device connected to the measuring resistor, wherein the control device is configured to operate the electrical circuit to detect the ground fault based on the change from the first voltage to the second voltage.

10. The electrical circuit of claim 9, wherein the control device is configured to control the power converter.

11. The electrical circuit of claim 8, further comprising a plurality of power converters, wherein at least two of the power converters being configured to operate the electrical circuit to detect the ground fault based on the change from the first voltage to the second voltage.

* * * * *